(12) United States Patent
Hwang et al.

(10) Patent No.: US 10,403,640 B2
(45) Date of Patent: Sep. 3, 2019

(54) SEMICONDUCTOR DEVICES INCLUDING INSULATING CAPPING STRUCTURES

(71) Applicant: Samsung Electronics Co., Ltd., Suwon-si, Gyeonggi-do (KR)

(72) Inventors: Chang Sun Hwang, Hwaseong-si (KR); Ki Chul Park, Hwaseong-si (KR); Young Beom Pyon, Suwon-si (KR); Byoung Ho Kwon, Hwaseong-si (KR); Bo Un Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/933,062

(22) Filed: Mar. 22, 2018

(65) Prior Publication Data

US 2019/0074289 A1    Mar. 7, 2019

(30) Foreign Application Priority Data

Sep. 4, 2017  (KR) .................. 10-2017-0112670

(51) Int. Cl.
*H01L 27/115* (2017.01)
*H01L 27/11582* (2017.01)
*H01L 23/535* (2006.01)
*H01L 27/11573* (2017.01)

(52) U.S. Cl.
CPC ...... *H01L 27/11582* (2013.01); *H01L 23/535* (2013.01); *H01L 27/11573* (2013.01)

(58) Field of Classification Search
CPC ............. H01L 27/11582; H01L 27/535; H01L 27/11573

See application file for complete search history.

(56) References Cited

U.S. PATENT DOCUMENTS

| | | | |
|---|---|---|---|
| 8,664,101 B2 | 3/2014 | Kim et al. | |
| 9,748,264 B1* | 8/2017 | Jiang | H01L 27/11582 |
| 9,991,280 B2* | 6/2018 | Nakamura | H01L 27/11582 |
| 2005/0014330 A1 | 1/2005 | Park et al. | |
| 2008/0242084 A1 | 10/2008 | Kim et al. | |
| 2012/0070944 A1 | 3/2012 | Kim et al. | |
| 2012/0149185 A1 | 6/2012 | Kim et al. | |

FOREIGN PATENT DOCUMENTS

| | | |
|---|---|---|
| KR | 10-2001-0097949 | 11/2001 |
| KR | 10-0955931 | 4/2010 |

\* cited by examiner

*Primary Examiner* — William Coleman
(74) *Attorney, Agent, or Firm* — Myers Bigel, P.A.

(57) ABSTRACT

A semiconductor device including an insulating capping structure is provided. The semiconductor device may include a plurality of gate electrodes vertically stacked on a substrate and an insulating capping structure on the plurality of gate electrodes. The insulating capping structure may include a first upper surface and a second upper surface. A first distance between the first upper surface and the substrate may be greater than a second distance between the second upper surface and the substrate. The first upper surface may not overly the second upper surface. The semiconductor device may include a memory cell vertical structure passing through the first upper surface, the plurality of gate electrodes, and the insulating capping structure. The memory cell vertical structure may be spaced apart from the second upper surface. The semiconductor device may include a bit line electrically connected to the memory cell vertical structure.

20 Claims, 17 Drawing Sheets

SEMICONDUCTOR DEVICES INCLUDING INSULATING CAPPING STRUCTURES

CROSS-REFERENCE TO RELATED APPLICATION

This application claims priority under 35 U.S.C. § 119 to Korean Patent Application No. 10-2017-0112670, filed on Sep. 4, 2017 in the Korean Intellectual Property Office, the entire contents of which are incorporated herein by reference in their entirety.

BACKGROUND

Embodiments of the inventive concepts relate to semiconductor devices and, more particularly, to semiconductor devices including insulating capping structures covering gate electrodes and methods of forming the same.

Semiconductor devices may respectively include gate electrodes that are stacked in a direction perpendicular to the surface of a semiconductor substrate and memory cell vertical structures passing through the gate electrodes. As the difficulty increases of semiconductor processes of forming contact plugs on the gate electrodes that are electrically connected to gate electrodes while passing through an insulating capping structure, it may be difficult to increase a degree of integration of semiconductor devices.

SUMMARY

Some embodiments of the inventive concepts may provide semiconductor devices that may increase a degree of integration.

According to some embodiments of the inventive concepts, semiconductor devices are provided. A semiconductor device may include a plurality of gate electrodes vertically stacked on a substrate and an insulating capping structure on the plurality of gate electrodes. The insulating capping structure may include a first upper surface and a second upper surface. A first distance between the first upper surface and the substrate being greater than a second distance between the second upper surface and the substrate. The first upper surface may not overly the second upper surface. The semiconductor device may include a memory cell vertical structure passing through the first upper surface, the plurality of gate electrodes, and the insulating capping structure. The memory cell vertical structure may be laterally spaced apart from the second upper surface. The semiconductor device may include a bit line electrically connected to the memory cell vertical structure.

According to some embodiments of the inventive concepts, semiconductor devices are provided. A semiconductor device may include a plurality of gate electrodes on a substrate and an insulating capping structure on the plurality of gate electrodes. The insulating capping structure may include a first surface layer and a second surface layer that is thicker than the first surface layer. The first surface layer may not overly the second surface layer. The semiconductor device may include a channel hole passing through the plurality of gate electrodes and the insulating capping structure, passing through the first surface layer, and spaced apart from the second surface layer. The semiconductor device may include a channel semiconductor layer within the channel hole. The channel semiconductor layer may extend in a direction perpendicular to a surface of the substrate.

According to some embodiments of the inventive concepts, semiconductor devices are provided. A semiconductor device may include a plurality of gate electrodes on a substrate and an insulating capping structure on the plurality of gate electrodes. The insulating capping structure may include a first upper surface and a second upper surface. The semiconductor device may include a channel hole extending in a direction perpendicular to a surface of the substrate to pass through the first upper surface, the plurality of gate electrodes, and the insulating capping structure. The semiconductor device may include a semiconductor channel layer within the channel hole. The semiconductor channel layer may extend in the direction perpendicular to the surface of the substrate. The semiconductor device may include a dielectric structure between the channel semiconductor layer and the plurality of gate electrodes. A difference between a first distance between the first upper surface and the substrate and a second distance between the second upper surface and the substrate may be less than a thickness of the dielectric structure.

BRIEF DESCRIPTION OF DRAWINGS

The above, and other aspects, features, and advantages of embodiments of the inventive concepts will be more clearly understood in view of the detailed description and the accompanying drawings.

DETAILED DESCRIPTION

Figure 1:
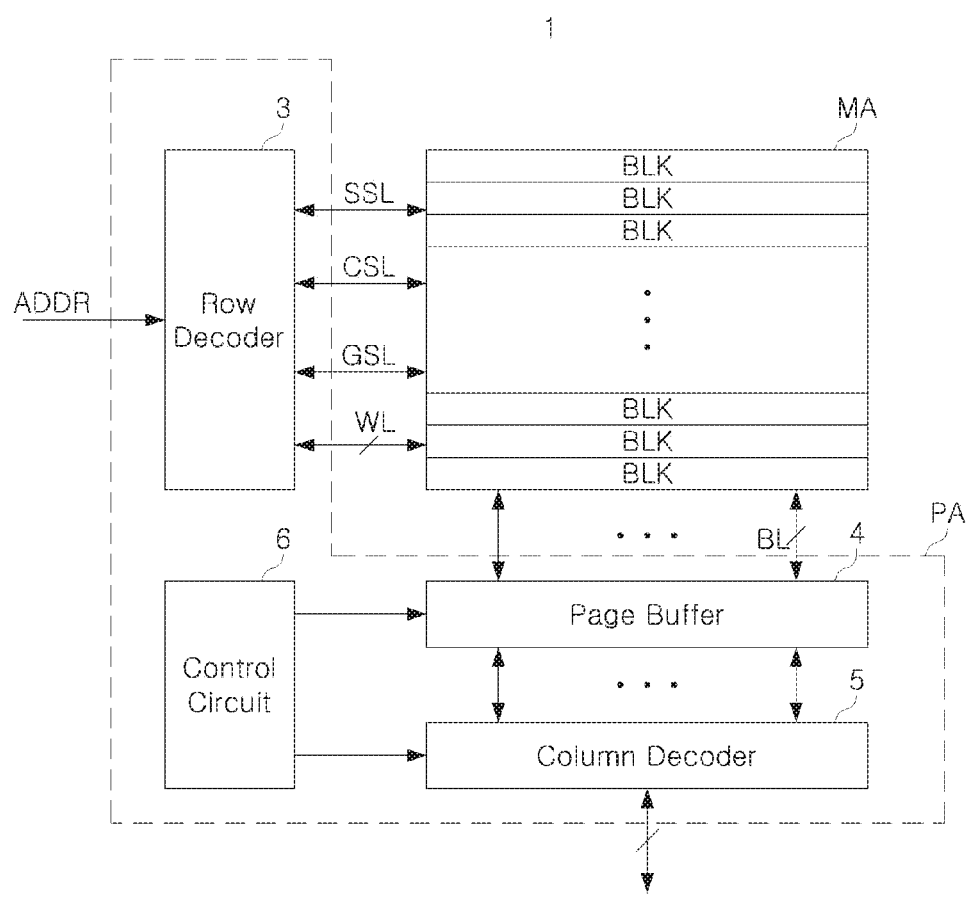
FIG. 1 is a schematic block diagram illustrating a semiconductor device, according to some embodiments of the inventive concepts.

FIG. 1 is a schematic block diagram of a semiconductor device, according to some embodiments of the inventive concepts.

Referring to FIG. 1, a semiconductor device 1 may include a memory cell array region MA and a peripheral circuit region PA. The peripheral circuit region PA may include a row decoder 3, a page buffer 4, a column decoder 5, and a control circuit 6.

The memory cell array region MA may include memory blocks BLK. The memory cell array region MA may include memory cells arranged in a plurality of rows and columns. The memory cells, included in the memory cell array region MA, may be electrically connected to the row decoder 3 through word lines WLs, at least one common source line CSL, string select lines SSLs, at least one ground select line GSL, and the like, and may be electrically connected to the page buffer 4 and the column decoder 5 through bit lines BLs.

It will be understood that when an element is referred to as being "connected" to, "coupled" to, or "on" another element, it may be directly connected to, coupled to, or on the other element or intervening elements may be present. In contrast, the term "directly" means that there are no intervening elements.

In some embodiments, some memory cells that are arranged in the same row may be connected to a common word line WL, and some memory cells that are arranged on the same column may be connected to a common bit line BL.

The row decoder 3 may be commonly connected to the memory blocks BLK, and may provide a driving signal to word lines WLs of memory blocks BLK selected in response to a block select signal. For example, the row decoder 3 may receive address ADDR information from an external source, and may decode the received ADDR information to determine levels of voltages supplied to at least a portion of the word lines WLs, the at least one common source line CSL, the string select lines SSLs, and the at least one ground select line GSL electrically connected to the memory blocks BLK.

The page buffer 4 may be electrically connected to the memory cell array region MA through the bit lines BLs. The page buffer 4 may be connected to a bit line BL selected according to an address decoded by the column decoder 5. The page buffer 4 may temporarily store data to be stored in the memory cells, or may detect data stored in the memory cells, according to operation modes. For example, the page buffer 4 may operate as a writing driver circuit in a data writing mode, and as a sensing amplifier circuit in a data reading mode. The page buffer 4 may receive power (for example, a voltage or current) from a control logic, and may supply the power to the selected bit line BL.

The column decoder 5 may provide a data transmission path between the page buffer 4 and an external device (for example, a memory controller). The column decoder 5 may decode addresses input from an external source to determine the bit lines BLs that are selected.

The column decoder 5 may be commonly connected to the memory blocks BLK, and may provide data information to bit lines BLs of memory blocks BLK selected in response to a block select signal.

The control circuit 6 may control the overall operations of the semiconductor device 1. The control circuit 6 may receive a control signal and an external voltage, and may operate in response to the received control signal. The control circuit 6 may include a voltage generator that generates voltages (for example, a data writing voltage, a data reading voltage, a data erasing voltage, or the like) required for internal operations, using the external voltage. The control circuit 6 may control data reading, writing, and/or erasing operations in response to control signals. As used herein, the term "and/or" includes any and all combinations of one or more of the associated listed items.

Figure 2:
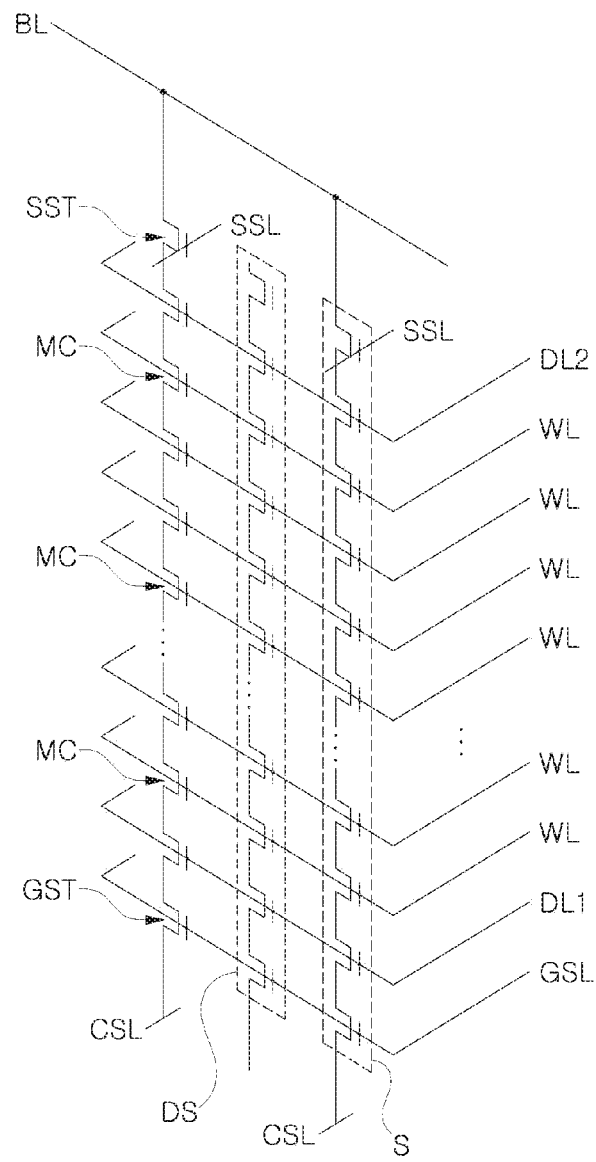
FIG. 2 is a circuit diagram conceptually illustrating a memory cell array of a semiconductor device, according to some embodiments of the inventive concepts.

FIG. 2 is a circuit diagram conceptually illustrating a memory cell array of a semiconductor device according to some embodiments of the inventive concepts. For example, the memory cell array of FIG. 2 may be part of the memory cell array region MA of FIG. 1.

Referring to FIGS. 1 and 2, the memory cell array region MA of FIG. 1 may include memory cell strings S, each including serially-connected memory cells MCs and a ground select transistor GST and a string select transistor SST connected to opposite ends of the memory cells MCs in series. The serially-connected memory cells MCs may be connected to word lines WLs for selecting the memory cells MCs, respectively.

A gate terminal of the ground select transistor GST may be connected to a ground select line GSL, and a source terminal of the ground select transistor GST may be connected to a common source line CSL. A gate terminal of the string select transistor SST may be connected to a string select line SSL, and a source terminal of the string select transistor SST may be connected to a drain terminal of the memory cells MCs. FIG. 2 illustrates a structure in which a single ground select transistor GST and a single string select transistor SST may be connected to the serially-connected memory cells MCs. In some embodiments, a plurality of ground select transistors GSTs or a plurality of string select transistors SSTs may be connected to the memory cells MCs.

In some embodiments, a lower dummy gate line DL1 may be between a lowermost word line WL of the word lines WLs and the ground select line GSL, and an upper dummy gate line DL2 may be between an uppermost word line WL of the word lines WLs and the string select line SSL.

It will be understood that spatially relative terms, such as "beneath," "below," "lower," "above," "upper" and the like, are intended to encompass different orientations of the device in use or operation in addition to the orientation depicted in the figures. For example, if the device in the figures is turned over, elements described as "below" or "beneath" other elements or features would then be oriented "above" the other elements or features. The device may be otherwise oriented (rotated 90 degrees or at other orientations) and the spatially relative descriptors used herein interpreted accordingly.

A drain terminal of the string select transistor SST may be connected to a bit line BL. When a signal is applied to the gate terminal of the string select transistor SST through the string select line SSL, the signal applied through the bit line BL may be transmitted to the memory cells MCs in the string, and a data reading/writing operation may thus be performed. Further, a data erasing operation of erasing data stored in the memory cells MCs may be performed by applying a data erasing voltage having a certain level to the memory cells MCs through a substrate.

The semiconductor device 1, according to some embodiments, may include at least one dummy string DS. The at least one dummy string DS may include a dummy channel electrically insulated from the bit line BL.

Figure 3:
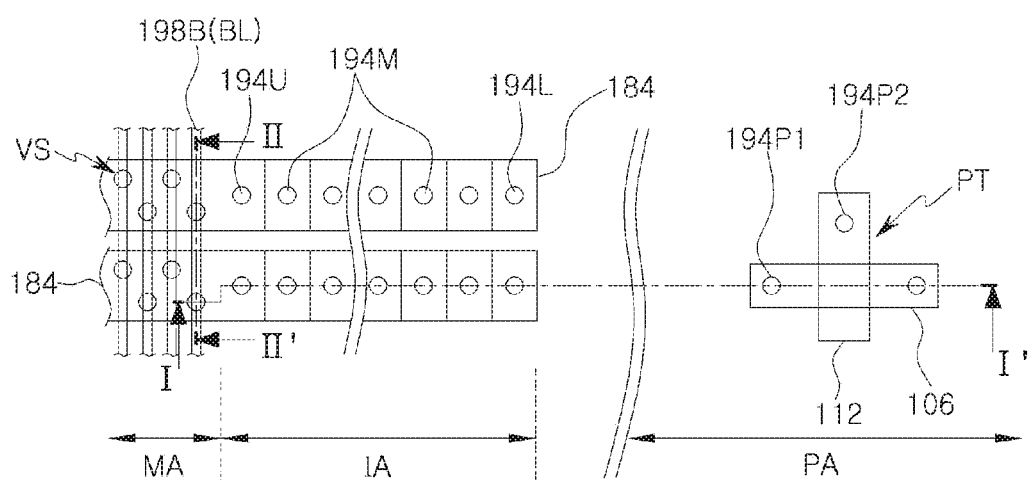
FIG. 3 is a plan view schematically illustrating a semiconductor device, according to some embodiments of the inventive concepts.
Figure 4A:
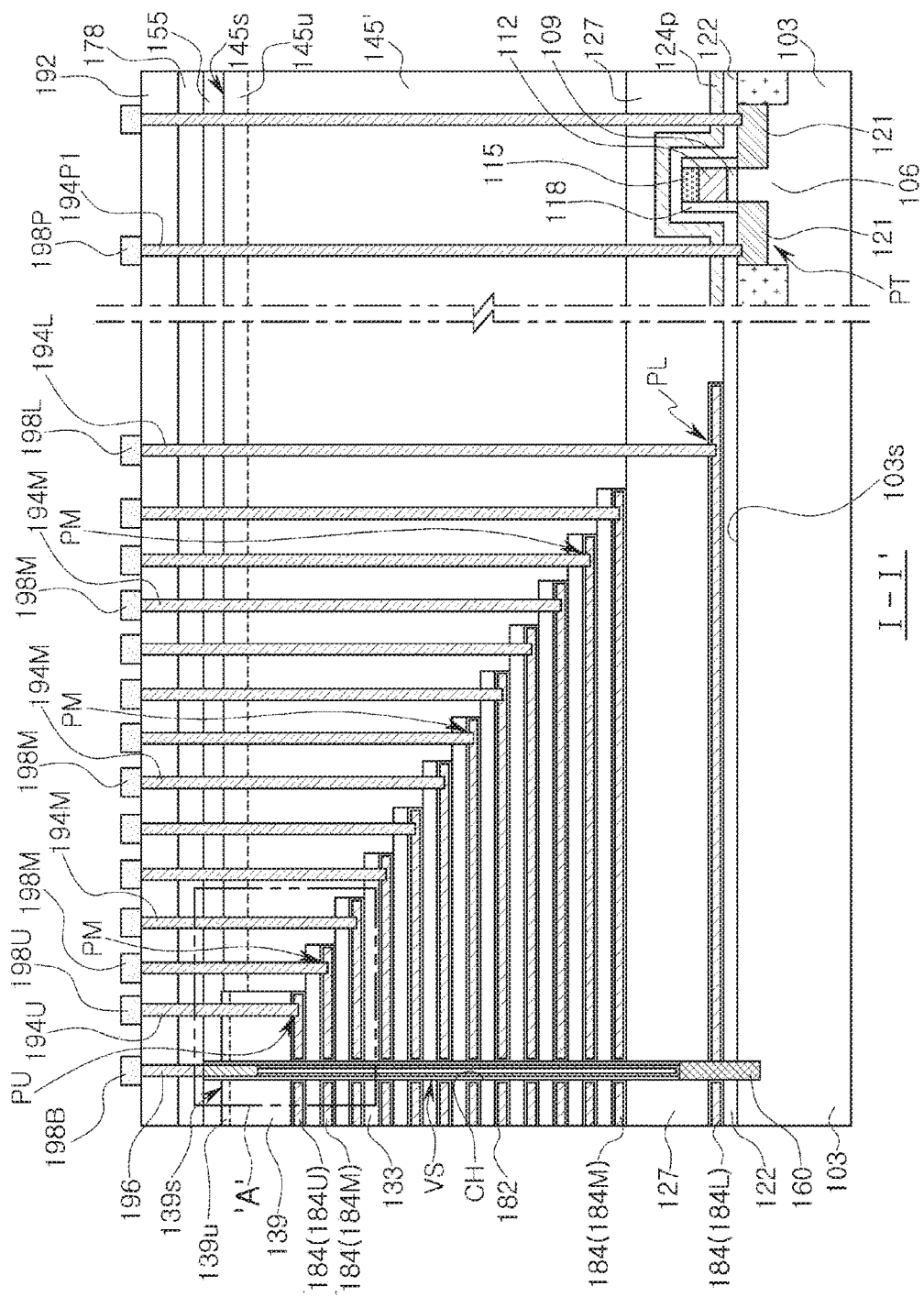
FIGS. 4A and 4B are cross-sectional views taken along a line I-I' and a line respectively, of FIG. 3.
Figure 4B:
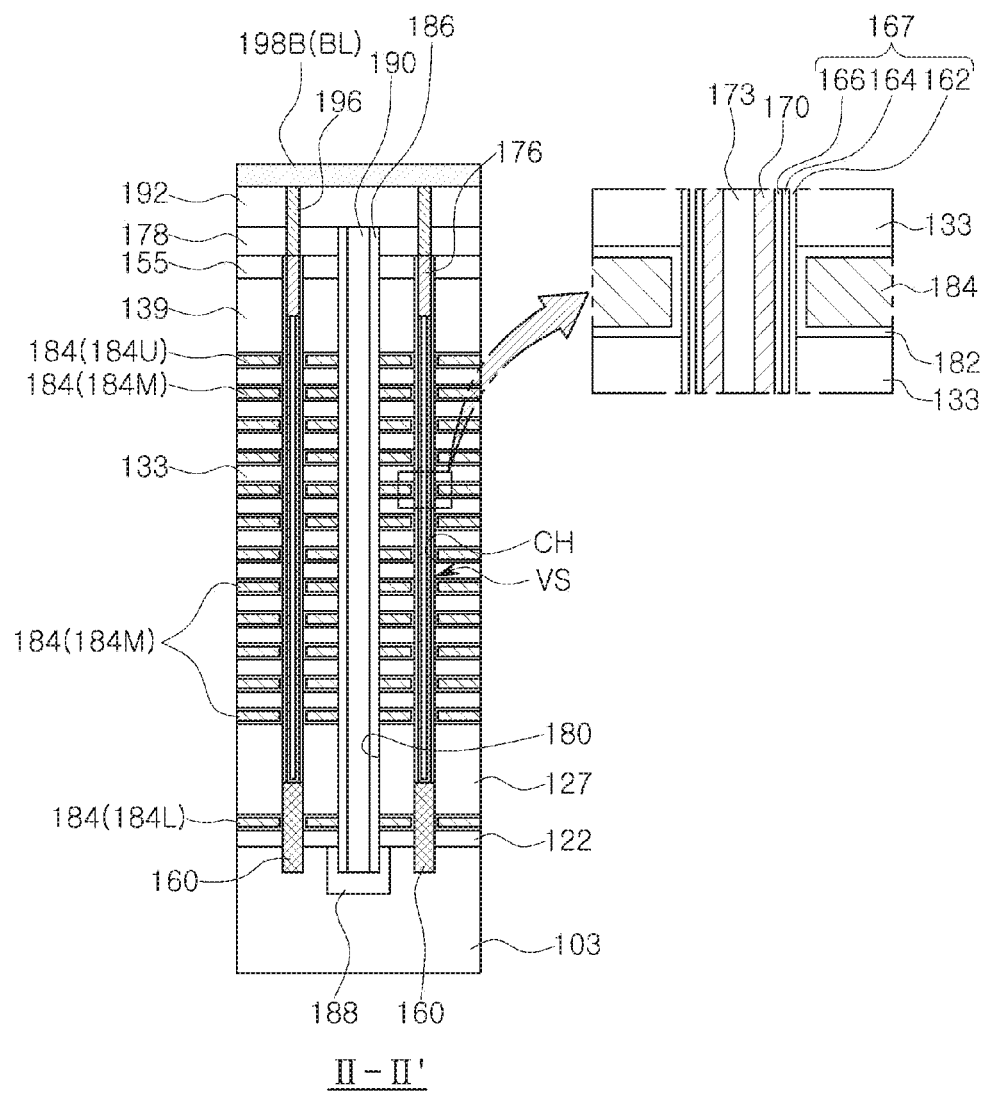
Figure 5:
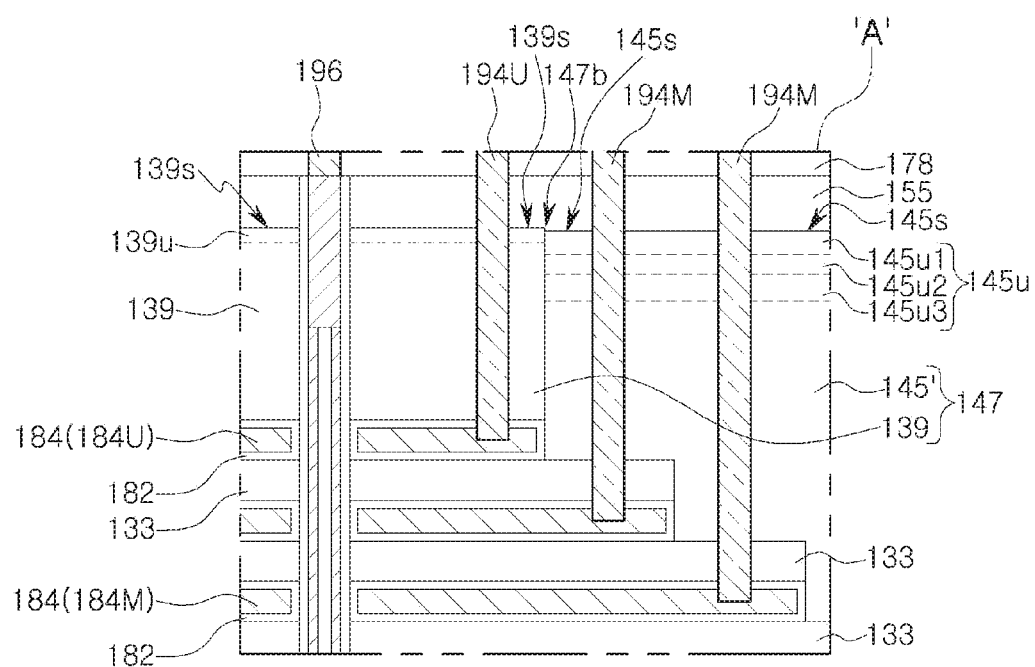
FIG. 5 is an enlarged view of part A of FIG. 4A.

FIG. 3 is a plan view illustrating a semiconductor device, according to some embodiments of the inventive concepts. FIG. 4A is a cross-sectional view taken along line I-I' of FIG. 3. FIG. 4B is a cross-sectional view taken along line II-II' of FIG. 3. FIG. 5 is an enlarged view of part A of FIG. 4A.

Referring to FIGS. 1, 2, 3, 4A, 4B, and 5, a substrate 103 may be provided. The substrate 103 may be formed of a semiconductor material, such as silicon or the like. The substrate 103 may be a monocrystalline silicon substrate or a polycrystalline silicon substrate. The substrate 103 may include the memory cell array region MA and the peripheral circuit region PA of FIG. 1. The memory cell array region MA may be a region in which the memory cells MCs of FIG. 2 may be disposed.

In some embodiments, the substrate 103 may include a connection region IA between the peripheral circuit region PA and the memory cell array region MA. The connection region IA may be a region including pad regions of gate electrodes. Each pad region may contact a respective contact plug for applying electrical signals or voltages to the string select lines SSLs of FIG. 2, the word lines WLs of FIG. 2, and/or the ground select line GSL of FIG. 2.

Gate electrodes 184 may extend parallel to a surface 103s of the substrate 103 and may be stacked in a direction perpendicular to the surface 103s in the memory cell array region MA. The gate electrodes 184 may have pad regions PU, PM, and PL extending in a direction parallel to the surface 103s of the substrate 103 so that the connection region IA has a stepped shape. The gate electrodes 184 may be formed of a conductive material including at least one of doped polysilicon, a metal nitride (for example, TiN), a metal silicide (for example, WSi, TiSi, TaSi, or the like), or a metal (for example, W). The doped polysilicon may be polysilicon including n-type impurities (for example, P, As, or the like), or p-type impurities (for example, B or the like).

The gate electrodes 184 may include a lower gate electrode 184L (hereinafter referred to as a lowermost gate electrode 184L), intermediate gate electrodes 184M on the lower gate electrode 184L, and an upper gate electrode 184U (hereinafter referred to as an uppermost gate electrode 184U) on the intermediate gate electrodes 184M.

In some embodiments, the lower gate electrode 184L may be the ground select line GSL of FIGS. 1 and 2. The lower gate electrode 184L may have a lower pad region PL, which may also be referred to as a ground select line pad region.

In some embodiments, the upper gate electrode 184U may be the string select lines SSLs of FIGS. 1 and 2. The upper gate electrode 184U may have an upper pad region PU, which may also be referred to as a string select line pad region.

In some embodiments, some or all of the intermediate gate electrodes 184M may be the word lines WLs of FIGS. 1 and 2. The intermediate gate electrodes 184M may have intermediate pad regions PM, which may also be referred to as word line pad regions.

In some embodiments, a lowermost intermediate gate electrode of the intermediate gate electrodes 184M may be the lower dummy gate line DL1 of FIG. 2, and an uppermost intermediate gate electrode may be the upper dummy gate line DL2 of FIG. 2.

A peripheral transistor PT may be in the peripheral circuit region PA. The peripheral transistor PT may include a peripheral gate dielectric 109 and a peripheral gate electrode 112 sequentially stacked in a peripheral active region 106 defined by an isolation region 105, and peripheral source/drain regions 121 in portions of the peripheral active region 106 on both sides of the peripheral gate electrode 112. A peripheral gate capping layer 115 having insulating properties may be on the peripheral gate electrode 112. Peripheral spacers 118 having insulating properties may be on lateral surfaces of the peripheral gate electrode 112 and the peripheral gate capping layer 115.

A lowermost insulating layer 122 may be between the lowermost gate electrode 184L and the substrate 103. The lowermost insulating layer 122 may extend to the peripheral circuit region PA to conformally cover the peripheral transistor PT. The lowermost insulating layer 122 may cover the peripheral gate capping layer 115 and the peripheral spacers 118.

A peripheral capping layer 124p may be on the lowermost insulating layer 122 in the peripheral circuit region PA. The peripheral capping layer 124p may be formed of a material different from that of the lowermost insulating layer 122. For example, the lowermost insulating layer 122 may be formed of a silicon oxide, and the peripheral capping layer 124p may be formed of a silicon nitride.

A lower insulating layer 127 may cover the lowermost gate electrode 184L, the peripheral transistor PT, and the peripheral capping layer 124p. The lower insulating layer 127 may cover the memory cell array region MA, the connection region IA, and the peripheral circuit region PA. The lower insulating layer 127 may have a planarized upper surface. The lower insulating layer 127 may be formed of a silicon oxide. The intermediate gate electrodes 184M may be on the lower insulating layer 127.

Interlayer insulating layers 133 may be between adjacent ones of the intermediate gate electrodes 184M and between an uppermost intermediate gate electrode of the intermediate gate electrodes 184M and the upper gate electrode 184U. The interlayer insulating layers 133 may be formed of a silicon oxide. A gate dielectric 182 may cover a lateral surface and a bottom surface of each of the gate electrodes 184.

An insulating capping structure 147 may cover the gate electrodes 184 and the peripheral transistor PT. The insulating capping structure 147 may have a first upper surface 139s and a second upper surface 145s. The second upper surface 145s may be stepped with respect to the first upper surface 139s. The second upper surface 145s may be closer to the substrate 103 than to the first upper surface 139s. A portion of the second upper surface 145s adjacent to the first upper surface 139s may be closer to the substrate 103 than to the first upper surface 139s. The insulating capping structure 147 may include a first insulating capping pattern 139 having the first upper surface 139s, and a second insulating capping pattern 145' having the second upper surface 145s.

It will be understood that, although the terms "first," "second," etc. may be used herein to describe various elements, these elements should not be limited by these terms. These terms are only used to distinguish one element from another. Thus, a first element could be termed a second element without departing from the teachings of the present inventive concepts.

In some embodiments, the first and second insulating capping patterns 139 and 145' may be formed of oxides having different properties. For example, the second insulating capping pattern 145' may be formed of an oxide that may have a density lower than that of the first insulating capping pattern 139, or an oxide that may be more porous than the first insulating capping pattern 139. In some embodiments, the second insulating capping pattern 145' may also be formed of a low-k dielectric having a dielectric constant lower than that of the first insulating capping pattern 139. In some embodiments, the first insulating capping pattern 139 may be formed of a silicon oxide formed at a temperature higher than that at which the second insulating capping pattern 145' is formed. In some embodiments, the second insulating capping pattern 145' may be formed by an oxide formation process having a formation or deposition rate higher than that at which the first insulating capping pattern 139 is formed. In some embodiments, the first insulating capping pattern 139 may include a first tetraethyl orthosilicate (TEOS) oxide, and the second insulating capping pattern 145' may include a second TEOS oxide formed at a temperature lower than that at which the first TEOS oxide is formed. In some embodiments, the first insulating capping pattern 139 may include an oxide (for example, a high density plasma oxide (HDP) or a plasma enhanced oxide (PEOX)) formed by a chemical vapor deposition (CVD) or plasma enhanced chemical vapor deposition (PECVD) process, and the second insulating capping pattern 145' may include an oxide (for example, a silicon oxide) formed by a flowable CVD or SOG process having a formation or deposition rate higher than that at which the first insulating capping pattern 139 is formed.

In some embodiments, the first insulating capping pattern 139 may include a first surface layer 139u, and the second insulating capping pattern 145' may include a second surface layer 145u. The first surface layer 139u may be in an upper portion of the first insulating capping pattern 139, and may be formed by hardening a surface of the first insulating capping pattern 139. The second surface layer 145u may be in an upper portion of the second insulating capping pattern 145', and may be formed by hardening a surface of the second insulating capping pattern 145'.

In some embodiments, the second surface layer 145u may be thicker than the first surface layer 139u. Thus, the second surface layer 145u of the second insulating capping pattern 145' may prevent or reduce problems or defects (for example, a process defect that may occur in a following semiconductor formation process performed after forming the second insulating capping pattern 145') that may occur, because the second insulating capping pattern 145' may be formed of an oxide that may have a density lower than that of the first insulating capping pattern 139, or an oxide that may be more porous than the first insulating capping pattern 139.

By an analyzer that may be embodied as a display, such as a scanning electron microscope (SEM), the first surface layer 139u may be observed as a relatively thin line shape, and the second surface layer 145u may be observed as a line shape thicker than the first surface layer 139u.

As shown in FIG. 5, in some embodiments, the second surface layer 145u may include an upper portion 145u1, an intermediate portion 145u2, and a lower portion 145u3 whose densities decrease sequentially in a downward direction.

The first insulating capping pattern 139 may be in the memory cell array region MA, may cover the upper gate electrode 184U on the top of the gate electrodes 184, and may cover the upper pad region PU of the upper gate electrode 184U in the connection region IA. Thus, the first insulating capping pattern 139, the first upper surface 139s, and the first surface layer 139u may overlap the upper gate electrode 184U that may be the string select line SSL of FIGS. 1 and 2, and the upper pad region PU of the upper gate electrode 184U. The first insulating capping pattern 139, the first upper surface 139s, and the first surface layer 139u may overlap the gate electrodes 184 in the memory cell array region MA, and the upper pad region PU of the upper gate electrode 184U. As used herein, a first layer, pattern, surface, or other element may be referred to as overlapping another layer, pattern, surface, or other element if the another layer, pattern, surface, or other element is between the first layer, pattern, surface, or other element and the substrate in a direction that is perpendicular to a surface of the substrate.

The second insulating capping pattern 145' may cover the peripheral circuit region PA, while covering the lower pad region PL of the lower gate electrode 184L and the intermediate pad regions PM of the intermediate gate electrodes 184M. Thus, the second insulating capping pattern 145', the second upper surface 145s, and the second surface layer 145u may overlap the intermediate pad regions PM that may be arranged to have the stepped shape, and the lower pad region PL.

The second insulating capping pattern 145' may have a lower surface on a level lower than that of a lower surface of the first insulating capping pattern 139. For example, the lower surface of the second insulating capping pattern 145' may be closer to the substrate 103 than to the lower surface of the first insulating capping pattern 139.

In some embodiments, the second insulating capping pattern 145' may be in contact with a portion of the lower insulating layer 127 that may not overlap the gate electrodes 184.

In some embodiments, the interlayer insulating layers 133 may extend to the intermediate pad regions PM of the intermediate gate electrodes 184M to contact the second insulating capping pattern 145'.

A first upper insulating layer 155 may be on the insulating capping structure 147. In other words, the first upper insulating layer 155 may be on the first upper surface 139s of the first insulating capping pattern 139 and on the second upper surface 145s of the second insulating capping pattern 145'. The first upper insulating layer 155 may be formed of a silicon oxide.

In some embodiments, a memory cell vertical structure VS may be within a channel hole CH in the memory cell array region MA. The channel hole CH and the memory cell vertical structure VS may extend in the direction perpendicular to the surface 103s of the substrate 103 to pass through the gate electrodes 184. For example, the channel hole CH and the memory cell vertical structure VS may pass through the lowermost insulating layer 122, the lower insulating layer 127, the interlayer insulating layers 133, the first insulating capping pattern 139 of the insulating capping structure 147, the first surface layer 139u, and the first upper surface 139s, while passing through the gate electrodes 184, and the channel hole CH and the memory cell vertical structure VS may pass through the first upper insulating layer 155. The channel hole CH and the memory cell vertical structure VS may be provided as a plurality of channel holes CH and a plurality of memory cell vertical structures VS, respectively.

In some embodiments, the memory cell vertical structure VS may include a semiconductor pattern 160, a core pattern 173, a pad pattern 176, a channel semiconductor layer 170, and a dielectric structure 167.

In some embodiments, a stepped portion between the first and second upper surfaces 139s and 145s of the insulating capping structure 147 may have a thickness less than that of the dielectric structure 167.

In some embodiments, the gate dielectric 182 may be between the memory cell vertical structure VS and each of the gate electrodes 184. The gate dielectric 182 may extend from a space between the memory cell vertical structure VS and the gate electrode 184 to upper and lower surfaces of the gate electrode 184.

In some embodiments, the stepped portion between the first and second upper surfaces 139s and 145s of the insulating capping structure 147 may have a thickness less than that of the gate dielectric 182. For example, the stepped portion between the first and second upper surfaces 139s and 145s may have a thickness of about 10 Å to about 20 Å, and the gate dielectric 182 may have a thickness of about 30 Å. The numerical value representing the size of the stepped portion between the first and second upper surfaces 139s and 145s, and the numerical value representing the thickness of the gate dielectric 182 may be examples, and embodiments of the inventive concepts are not limited to these numerical values. For example, the above-mentioned respective numerical values may also be changed.

The semiconductor pattern 160 may be in contact with the substrate 103. The semiconductor pattern 160 may be an epitaxial material layer that may be formed by a selective epitaxial growth (SEG) process. The semiconductor pattern 160 may be formed of monocrystalline epitaxial silicon. The semiconductor pattern 160 may have a lateral surface facing that of the lowermost gate electrode 184L, and may be on a level lower than that of the intermediate gate electrodes 184M. In other words, an upper surface of the semiconductor pattern 160 may be closer to the substrate 103 than lower surfaces of the intermediate gate electrodes 184M.

The core pattern 173 may be on the semiconductor pattern 160, and may be formed of an insulating material (for example, a silicon oxide or the like). The pad pattern 176 may be on the core pattern 173. The pad pattern 176 may be formed of polycrystalline silicon having n-type conductivity, and may be a drain region. The pad pattern 176 may be on a level higher than that of the gate electrodes 184. In other words, upper surfaces of the gate electrodes 184 may be closer to the substrate 103 than a lower surface of the pad pattern 176.

The channel semiconductor layer 170 may be within the channel hole CH, and may extend in the direction perpendicular to the surface 103s of the substrate 103. The channel semiconductor layer 170 may be in contact with the semiconductor pattern 160. The channel semiconductor layer 170 may cover a lateral surface of the core pattern 173, and may be in contact with the pad pattern 176. The channel semiconductor layer 170 may pass through the intermediate gate electrodes 184M of the gate electrodes 184 and the upper gate electrode 184U. The channel semiconductor layer 170 may be formed of a polysilicon layer.

The dielectric structure 167 may be between the channel semiconductor layer 170 and the gate electrodes 184, while covering an outer portion of the channel semiconductor layer 170.

At least one of the dielectric structure 167 and the gate dielectric 182 may include a layer for storing data. For example, the dielectric structure 167 may include a layer for storing data. However, embodiments of the inventive concepts are not limited thereto. For example, the gate dielectric 182 may include a layer for storing data. Hereinafter, the dielectric structure 167 including a layer for storing data will be described.

The dielectric structure 167 may include a tunnel dielectric layer 166, a data storage layer 164, and a blocking dielectric layer 162. The data storage layer 164 may be between the tunnel dielectric layer 166 and the blocking dielectric layer 162. The tunnel dielectric layer 166 may be adjacent the channel semiconductor layer 170, and the blocking dielectric layer 162 may be adjacent the gate electrodes 184.

The tunnel dielectric layer 166 may include a silicon oxide and/or an impurity-doped silicon oxide. The blocking dielectric layer 162 may include a silicon oxide and/or a high-k dielectric.

The data storage layer 164 may be a layer for storing data in a non-volatile memory device, such as a flash memory device or the like. For example, the data storage layer 164 may be formed of a material, for example, a silicon nitride, that may trap and retain electrons injected from the channel semiconductor layer 170 through the tunnel dielectric layer 166, or that may remove electrons trapped within the data storage layer 164, according to operating conditions of the non-volatile memory device, such as the flash memory device or the like. The gate dielectric 182 may include a high-k material, such as, for example, A1O or the like.

The data storage layer 164 may store data in regions facing the intermediate gate electrodes 184M of the gate electrodes 184 that may correspond to the word lines WLs of FIG. 2. The regions in which the data storage layer 164 of the memory cell vertical structure VS may store data may be arranged in the direction perpendicular to the surface 103s of the substrate 103, and may be defined as the memory cells MCs of FIG. 2.

A second upper insulating layer 178 may be on the first upper insulating layer 155. The second upper insulating layer 178 may be formed of a silicon oxide.

A separation trench 180 may extend to the substrate 103, while passing through the first and second upper insulating layers 155 and 178 and the gate electrodes 184, such that the substrate 103 may be exposed by the separation trench 180. The separation trench 180 may pass through the interlayer insulating layers 133, the lower insulating layer 127, and the lowermost insulating layer 122.

A source pattern 190 may be within the separation trench 180. An insulating spacer 186 may be between a lateral surface of the source pattern 190 and a side wall of the separation trench 180. The insulating spacer 186 may be in contact with the gate electrodes 184.

The insulating spacer 186 may be formed of an insulating material, such as a silicon oxide or a silicon nitride. The source pattern 190 may be formed of a conductive material including at least one of doped polysilicon, a metal nitride, such as a titanium nitride or the like, or a metal, such as tungsten or the like.

An impurity region 188 may be within a portion of the substrate 103 below the source pattern 190. In some embodiments, the impurity region 188 may be the common source line CSL of FIGS. 1 and 2 described above with reference to FIGS. 1 and 2. The impurity region 188 may be an n-type impurity region.

A third upper insulating layer 192 may be on the second upper insulating layer 178. The third upper insulating layer 192 may be formed of a silicon oxide.

Gate contact plugs 194U, 194M, and 194L may be on the pad regions PU, PM, and PL of the gate electrodes 184, respectively. The gate contact plugs 194U, 194M, and 194L may include an upper gate contact plug 194U formed on the upper pad region PU of the upper gate electrode 184U, intermediate gate contact plugs 194M formed on the intermediate pad regions PM of the intermediate gate electrodes 184M, and a lower gate contact plug 194L formed on the lower pad region PL of the lower gate electrode 184L.

The upper gate contact plug 194U may pass through the first to third upper insulating layers 155, 178, and 192, may pass through the first insulating capping pattern 139 of the insulating capping structure 147, and may be electrically connected to the upper pad region PU of the upper gate electrode 184U. When the upper gate electrode 184U is the string select line SSL of FIGS. 1 and 2, the upper pad region PU may be a string select line pad region.

The intermediate gate contact plugs 194M may pass through the first to third upper insulating layers 155, 178, and 192, may pass through the second insulating capping pattern 145' of the insulating capping structure 147, and may be electrically connected to the intermediate pad regions PM of the intermediate gate electrodes 184M. When the intermediate gate electrodes 184M are the word lines WLs of FIGS. 1 and 2, the intermediate pad regions PM may be word line pad regions.

In the insulating capping structure 147, a boundary 147b between the first insulating capping pattern 139 and the second insulating capping pattern 145' may be between the upper gate contact plug 194U and the intermediate gate contact plugs 194M.

The lower gate contact plug 194L may pass through the first to third upper insulating layers 155, 178, and 192, may pass through the second insulating capping pattern 145', may pass through the lower insulating layer 127, and may be electrically connected to the lower pad region PL of the lower gate electrode 184L. When the lower gate electrode 184L is the ground select line GSL of FIGS. 1 and 2, the lower pad region PL may be a ground select line pad region.

Peripheral contact plugs 194P1 and 194P2 may be electrically connected to the peripheral transistor PT, while passing through the first to third upper insulating layers 155, 178, and 192, the second insulating capping pattern 145′, and the lower insulating layer 127. The peripheral contact plugs 194P1 and 194P2 may include first peripheral contact plug 194P1 of FIGS. 3 and 4A electrically connected to the peripheral source/drain regions 121 of the peripheral transistor PT, and a second peripheral contact plug 194P2 of FIG. 3 electrically connected to the peripheral gate electrode 112 of the peripheral transistor PT.

A bit line contact plug 196 may pass through the second and third upper insulating layers 178 and 192, and may be in contact with the pad pattern 176 of the memory cell vertical structure VS.

Conductive patterns may be on the third upper insulating layer 192. The conductive patterns may include a first conductive pattern 198U electrically connected to the upper gate contact plug 194U, second conductive patterns 198M electrically connected to the intermediate gate contact plugs 194M, a third conductive pattern 198L electrically connected to the lower gate contact plug 194L, a fourth conductive pattern 198B electrically connected to the bit line contact plug 196, and a fifth conductive pattern 198P electrically connected to the first peripheral contact plug 194P1.

The fourth conductive pattern 198B electrically connected to the bit line contact plug 196 may be one of the bit lines BLs of FIGS. 1 and 2 described above with reference to FIGS. 1 and 2. Thus, the memory cell vertical structure VS may be electrically connected to the fourth conductive pattern 198B, for example, the one of the bit lines BL of FIGS. 1 and 2, through the bit line contact plug 196.

Methods of forming the semiconductor devices described above with reference to FIGS. 3, 4A, 4B, and 5, will be described with reference to FIGS. 3, and 6 through 15B. FIGS. 6, 7, 8, 10, 12, 13, 14, 15A, and 15B are cross-sectional views schematically illustrating operations of methods of forming semiconductor devices, according to some embodiments of the inventive concepts. FIGS. 9 and 11 are cross-sectional views schematically illustrating planarization processes of methods of forming semiconductor devices, according to some embodiments of the inventive concepts. FIGS. 6, 7, 8, 10, 12, 13, 14, and 15A are cross-sectional views taken along line I-I' of FIG. 3, and FIG. 15B is a cross-sectional view taken along line II-II' of FIG. 3.

Figure 6:
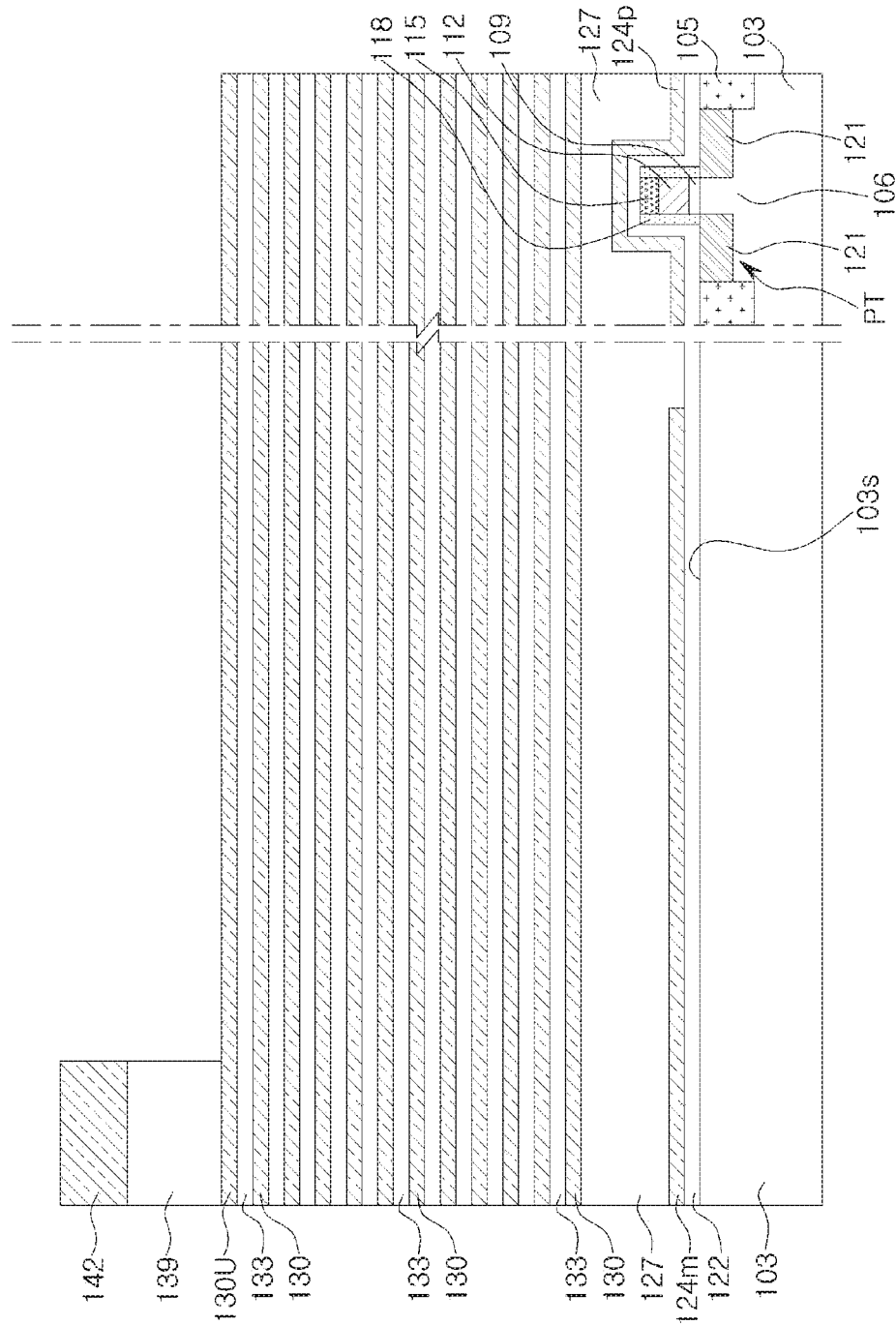
FIGS. 6, 7, 8, 10, 12, 13, 14, 15A, and 15B are cross-sectional views schematically illustrating operations of methods of forming semiconductor devices, according to some embodiments of the inventive concepts.

Referring to FIGS. 3 and 6, a substrate 103 may be prepared, having a memory cell array region MA, a peripheral circuit region PA spaced apart from the memory cell array region MA, and a connection region IA between the memory cell array region MA and the peripheral circuit region PA. The substrate 103 may be a semiconductor substrate which may be formed of a semiconductor material.

A peripheral transistor PT may be formed in the peripheral circuit region PA. Forming the peripheral transistor PT may include forming an isolation region 105 defining a peripheral active region 106 within the substrate 103, forming a peripheral gate dielectric 109, a peripheral gate electrode 112, and a peripheral gate capping layer 115 sequentially stacked on the peripheral active region 106, forming peripheral spacers 118 having insulating properties on lateral surfaces of the peripheral gate electrode 112 and the peripheral gate capping layer 115, and forming peripheral source/drain regions 121 within portions of the peripheral active region 106 on both sides of the peripheral gate electrode 112.

A lowermost insulating layer 122 may be formed to cover the memory cell array region MA, the connection region IA, and the peripheral circuit region PA. The lowermost insulating layer 122 may conformally cover the peripheral transistor PT.

A sacrificial material layer may be formed on the lowermost insulating layer 122 and the sacrificial material layer may be patterned to form a lower sacrificial layer 124*m* and a peripheral capping layer 124*p*. The lower sacrificial layer 124*m* may extend to the connection region IA, while covering the memory cell array region MA, and the peripheral capping layer 124*p* may be formed in the peripheral circuit region PA. The lower sacrificial layer 124*m* and the peripheral capping layer 124*p* may be formed of the same material, for example, a silicon nitride.

A lower insulating layer 127 may be formed to cover the lower sacrificial layer 124*m* and the peripheral capping layer 124*p*.

A plurality of sacrificial layers 130 and a plurality of interlayer insulating layers 133 may be formed to be alternately stacked on the lower insulating layer 127. An upper sacrificial layer 130U may be formed on an interlayer insulating layer on the top of the interlayer insulating layers 133.

The upper sacrificial layer 130U, the sacrificial layers 130, and the lower sacrificial layer 124*m* may be formed of the same material, for example, a silicon nitride.

A first insulating capping pattern 139 and a planarization pattern 142 may be formed to be sequentially stacked on the upper sacrificial layer 130U. The first insulating capping pattern 139 may be formed of a material different from that of the planarization pattern 142. For example, the first insulating capping pattern 139 may be formed of a silicon oxide, and the planarization pattern 142 may be formed of a silicon nitride.

Figure 7:
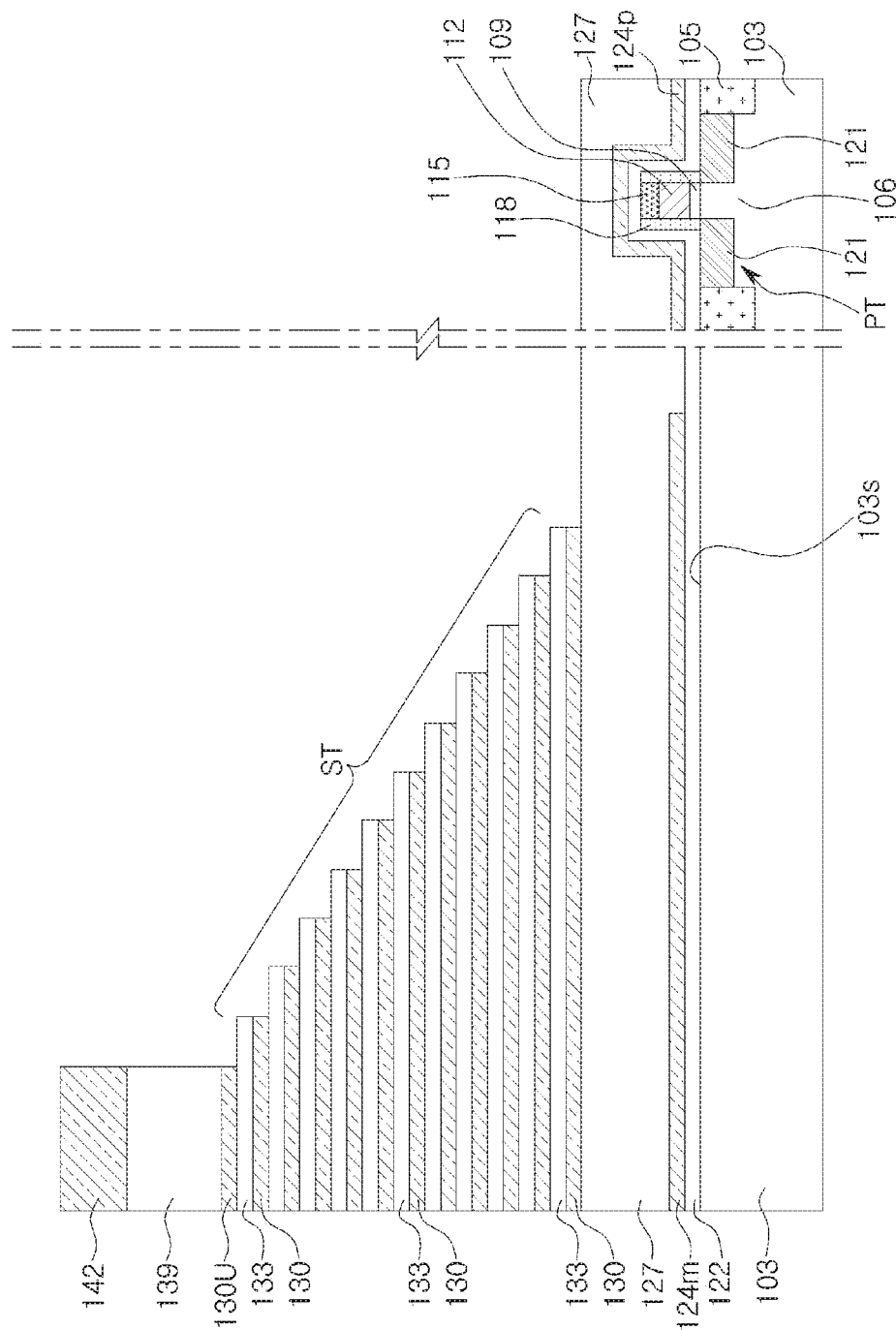

Referring to FIGS. 3 and 7, the upper sacrificial layer 130U may be etched using the first insulating capping pattern 139 and the planarization pattern 142 as an etching mask. Thus, a lateral surface of the upper sacrificial layer 130U may be aligned vertically with lateral surfaces of the first insulating capping pattern 139 and the planarization pattern 142.

The sacrificial layers 130 and the interlayer insulating layers 133 may be patterned to form a stepped shape ST sequentially descending as it goes away from the memory cell array region MA, and to expose the lower insulating layer 127.

Figure 8:
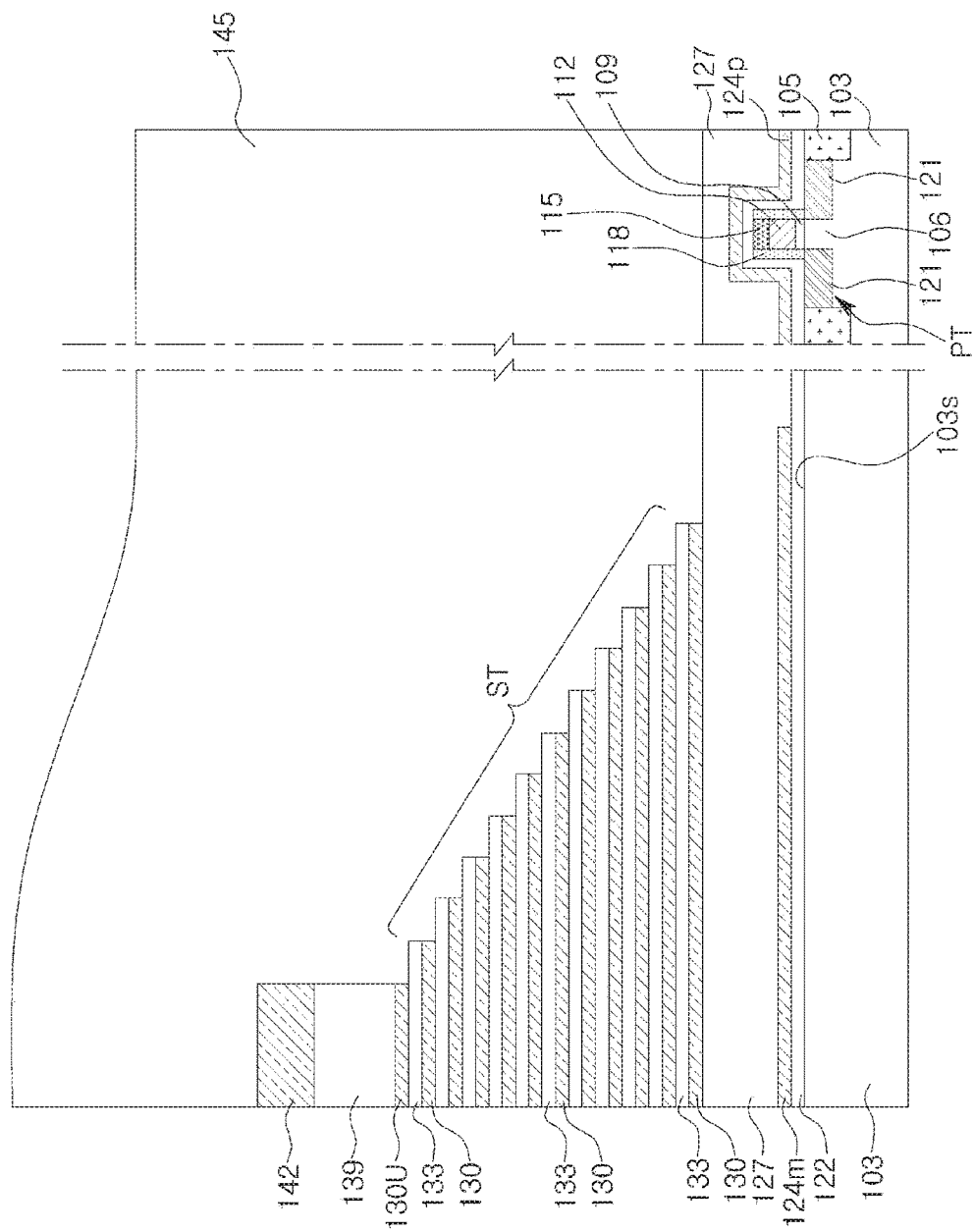
Figure 9:
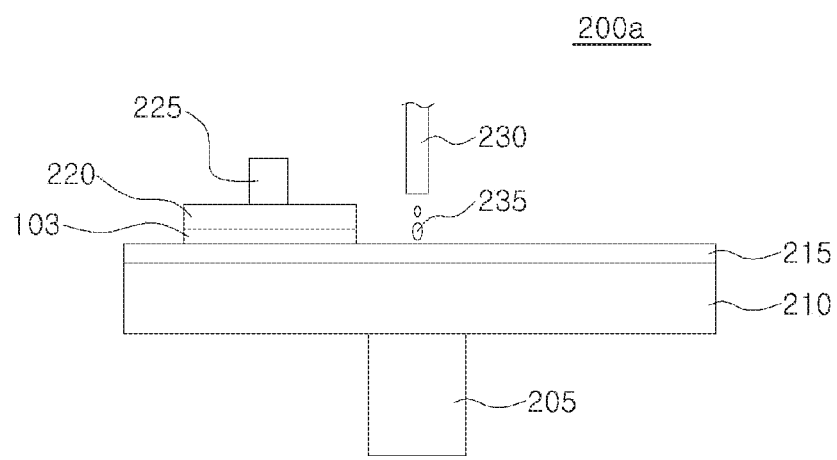
FIGS. 9 and 11 are cross-sectional views schematically illustrating planarization processes of methods of forming semiconductor devices, according to some embodiments of the inventive concepts.

Referring to FIGS. 3 and 8, a second insulating capping layer 145 may be formed on a surface 103*s* of the substrate 103 on which the stepped shape ST has been formed. The second insulating capping layer 145 may be formed of an oxide that may have a density lower than that of the first insulating capping pattern 139, or an oxide that may be more porous than the first insulating capping pattern 139. For example, the first insulating capping pattern 139 may be formed of a first TEOS oxide formed at a first process temperature, and the second insulating capping layer 145 may be formed of a second TEOS oxide formed at a second process temperature lower than the first process temperature. Alternatively, the first insulating capping pattern 139 may include a silicon oxide formed by a CVD or PECVD process, and the second insulating capping layer 145 may include a silicon oxide formed by a flowable CVD or SOG process having a formation or deposition rate higher than that at which the first insulating capping pattern 139 is formed.

The level of a portion of the second insulating capping layer 145 covering the peripheral circuit region PA may be lower than that of a portion thereof covering the planarization pattern 142.

Figure 10:
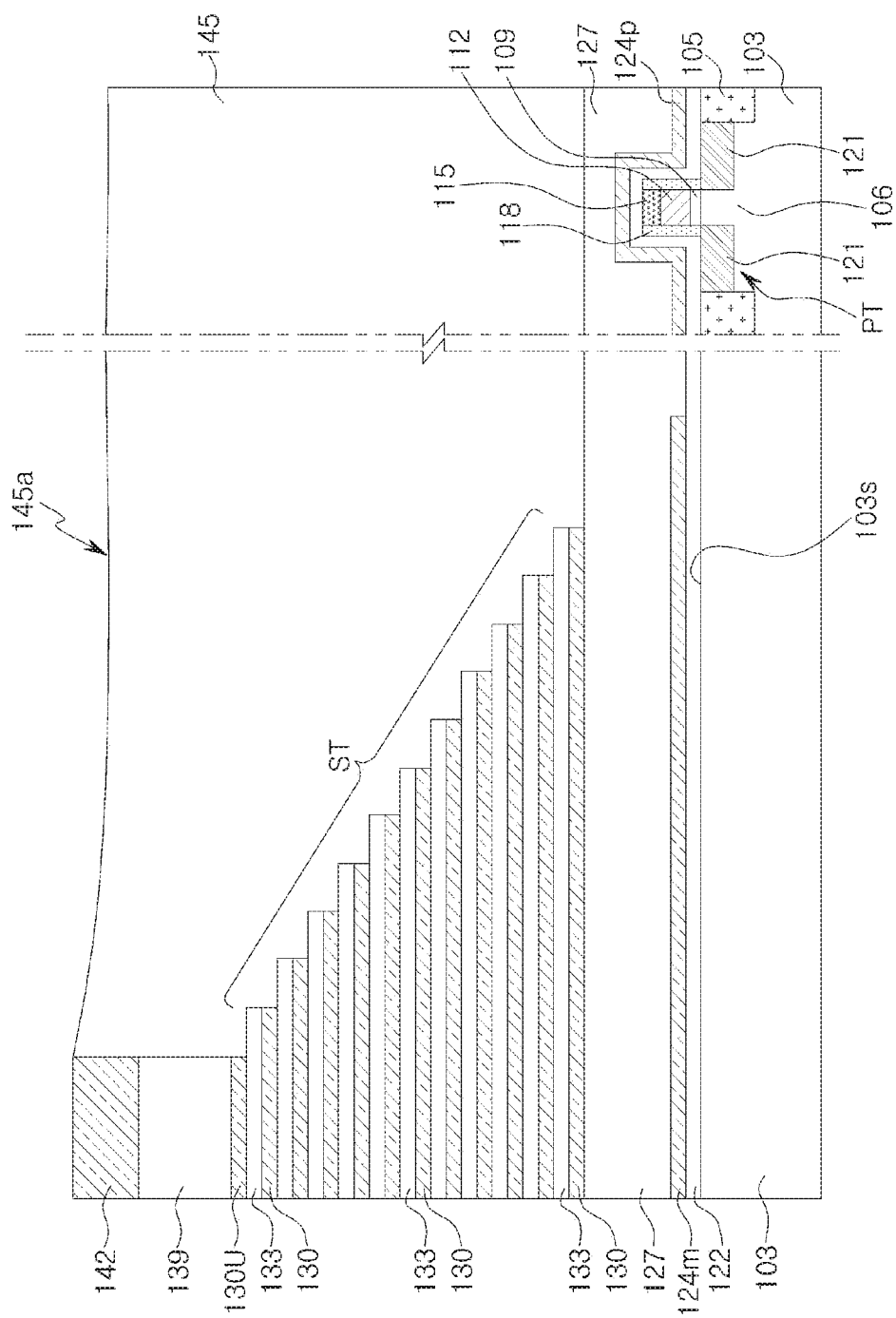
Figure 11:
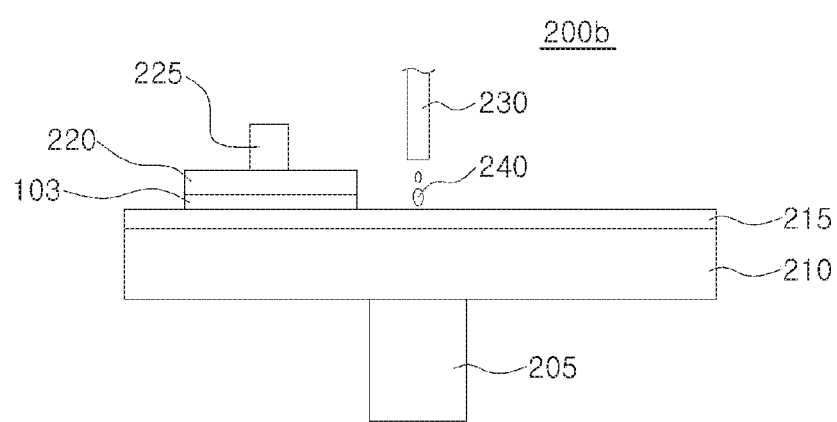

Referring to FIGS. 3, 9, and 10, a first planarization process 200a of planarizing the second insulating capping layer 145 may be performed. The first planarization process 200a may include planarizing the second insulating capping layer 145 until an upper surface of the planarization pattern 142 is exposed, using planarization process equipment. The planarization process equipment may include a polishing head 220, a polishing pad 215, a platen 210, a driving shaft 205, a driving means 225, and a slurry supply arm 230. The polishing pad 215 may attach to the top of the platen 210, and the driving shaft 205 may be below the platen 210 to rotate the platen 210 and the polishing pad 215. The driving means 225 may attach to an upper portion of the polishing head 220 to move the polishing head 220 in a direction perpendicular to a surface of the polishing head 220 and to rotate the polishing head 220.

The first planarization process 200a may include mounting the substrate 103, having the second insulating capping layer 145 formed thereon, on a lower surface of the polishing head 220, bring the second insulating capping layer 145 in contact with the polishing pad 215, and chemically and/or mechanically polishing the second insulating capping layer 145 on the substrate 103 by respectively rotating the polishing pad 215 and the polishing head 220, while supplying a first slurry 235 from the slurry supply arm 230, until the planarization pattern 142 is exposed. An upper surface 145a of the second insulating capping layer 145 may be recessed in a downward direction, due to a dishing phenomenon.

Figure 12:
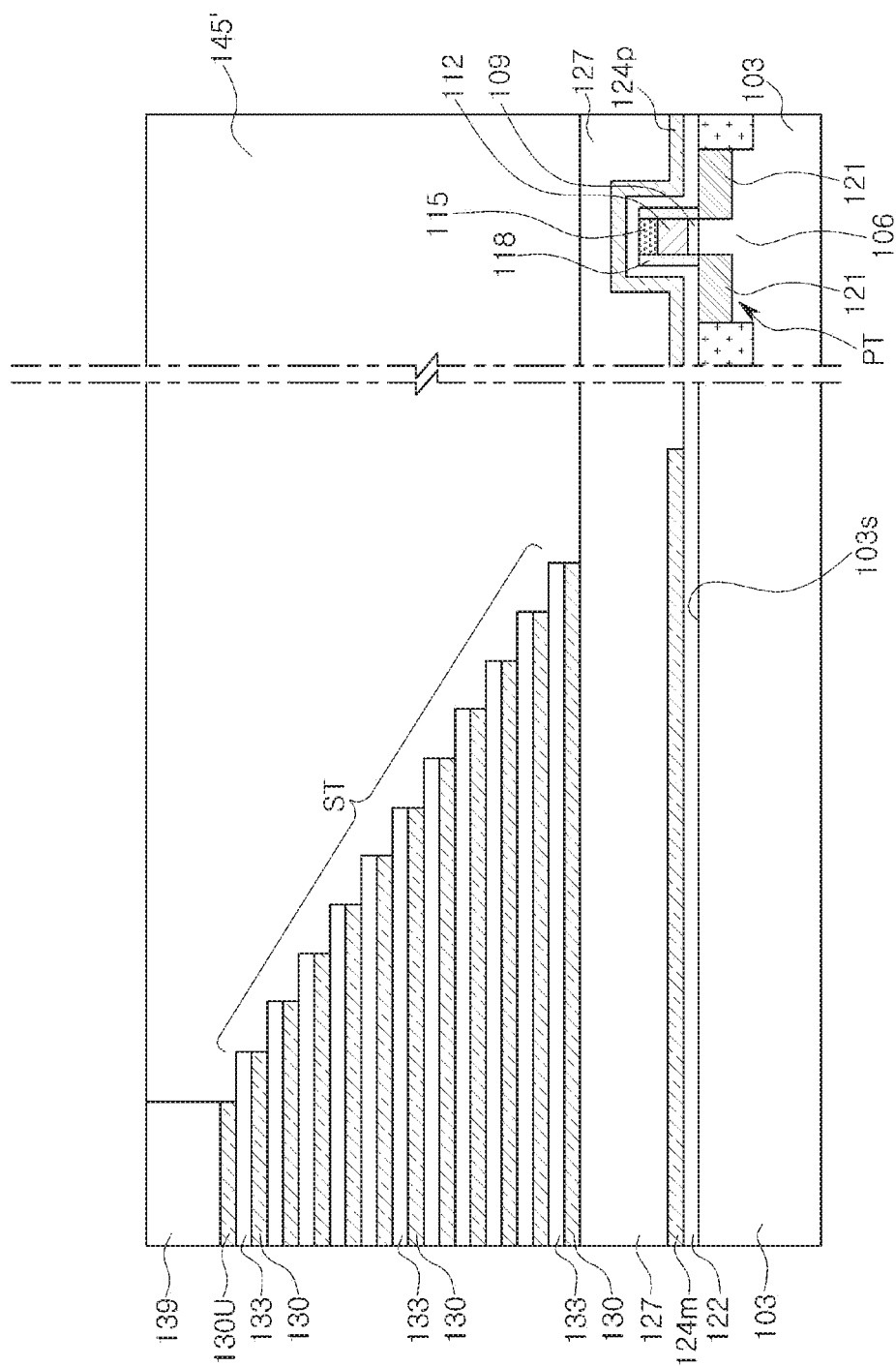

Referring to FIGS. 3, 11, and 12, a second planarization process 200b may be performed to polish the planarization pattern 142 until the first insulating capping pattern 139 is exposed, thus removing the planarization pattern 142. While the planarization pattern 142 is removed, the second insulating capping layer 145 may be planarized. The second insulating capping layer 145 may have a density lower than that of the planarization pattern 142, while having a density lower than that of the first insulating capping pattern 139.

The second planarization process 200b may be performed continuously from the first planarization process 200a, while replacing the first slurry 235, used in the first planarization process 200a, with a second slurry 240, different from the first slurry 235, by the planarization process equipment. For example, the first slurry 235 used in the first planarization process 200a may be used to polish a silicon oxide, and the second slurry 240 may be used to polish a silicon oxide, while being used to polish a silicon nitride. For example, the second slurry 240 may have a selection ratio of silicon nitride to silicon oxide of 10 or more. Thus, the second slurry 240 may planarize the second insulating capping layer 145 by polishing the second insulating capping layer 145 that may be formed of a silicon oxide having a density lower than those of the first insulating capping pattern 139 and the planarization pattern 142, while polishing and removing the planarization pattern 142 that may be formed of a silicon nitride. After the planarization pattern 142 is removed by the second planarization process 200b, the second planarization process 200b may continue to be performed to lower an upper surface of the first insulating capping pattern 139. In this process, an upper surface of the second insulating capping layer 145 having a relatively low density may also be lowered, and thus the second insulating capping layer 145 may be planarized to have an upper surface coplanar with the upper surface of the first insulating capping pattern 139. As described above, the second insulating capping layer 145 may be formed as a second insulating capping pattern 145' planarized by the continuous first and second planarization processes 200a and 200b.

The substrate 103 having the second insulating capping pattern 145' may be separated from the planarization process equipment.

Figure 13:
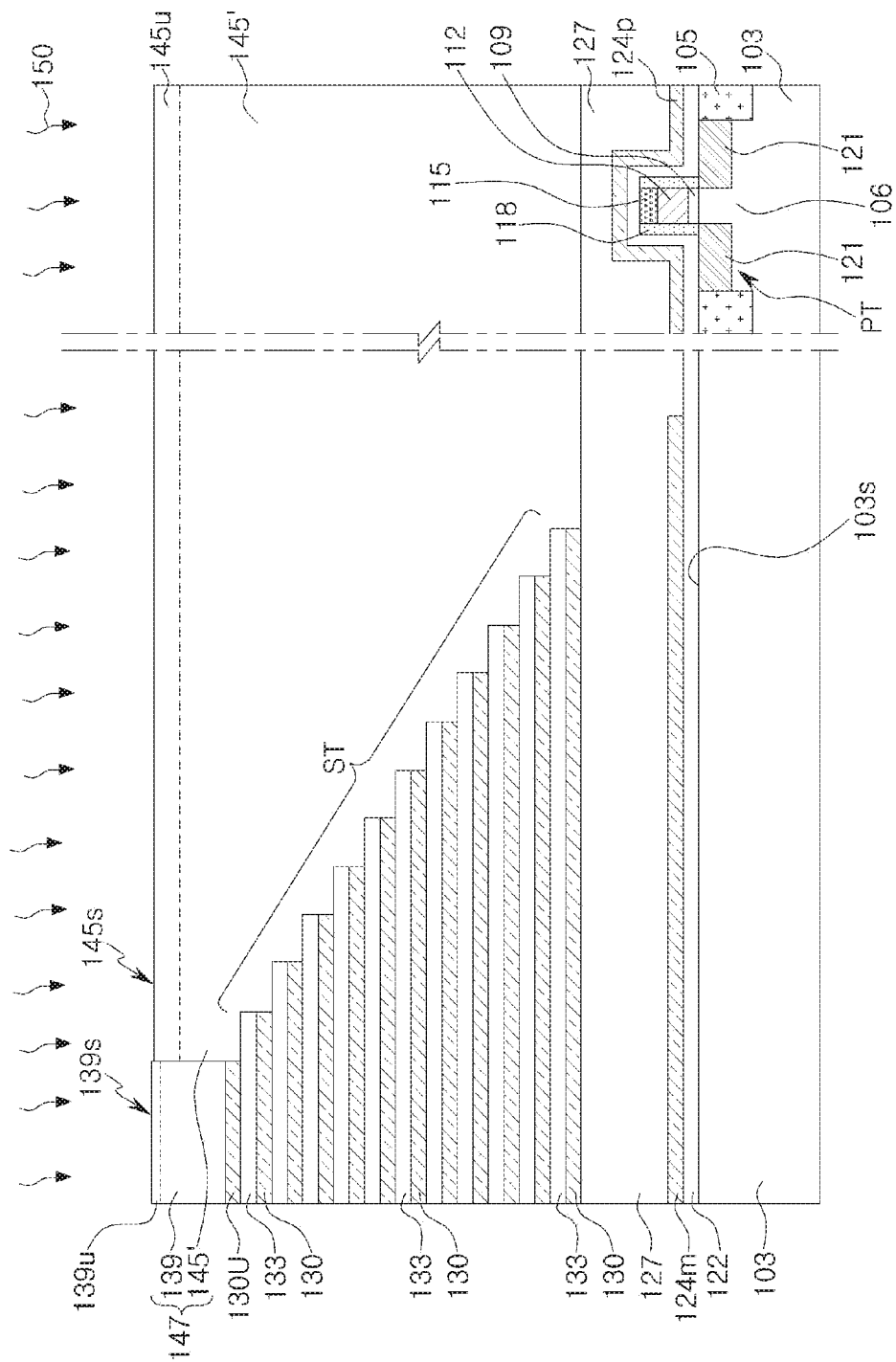

Referring to FIGS. 3 and 13, an annealing process 150 may be performed to harden a surface of the second insulating capping pattern 145'. The annealing process 150 may be performed at a process temperature of about 500° C. to about 1,000° C. in a wet atmosphere during a process time of about 30 minutes to about 2 hours. Thus, a second surface layer 145u may be formed on the surface of the second insulating capping pattern 145'.

In some embodiments, during the annealing process 150, a surface of the first insulating capping pattern 139 may also be hardened, and thus a first surface layer 139u may be formed on the surface of the first insulating capping pattern 139. The second surface layer 145u may be thicker than the first surface layer 139u.

Because the second insulating capping pattern 145' may be formed of a silicon oxide having a density lower than that of the first insulating capping pattern 139, the second insulating capping pattern 145' may be contracted by the annealing process 150 and an upper surface of the second insulating capping pattern 145' may be lowered. Thus, the first insulating capping pattern 139 may have a first upper surface 139s, and the second insulating capping pattern 145' may have a second upper surface 145s lower than the first upper surface 139s.

The annealing process 150 may be controlled, such that a stepped portion between the first and second upper surfaces 139s and 145s may have a thickness of about 10 Å to about 20 Å. In other words, a difference between a first distance between the first upper surface 139s of the first insulating capping pattern 139 and the surface 103s of the substrate 103 and a second distance between the second upper surface 145s of the second insulating capping pattern 145' and the surface 103s of the substrate 103 may be about 10 Å to about 20 Å. The size of the stepped portion between the first and second upper surfaces 139s and 145s as described above may be readily adjusted by controlling a temperature or time of the annealing process 150. The size of the stepped portion between the first and second upper surfaces 139s and 145s as described above may be changed, according to the size of patterns to be formed in a following process or to the difficulty of a following photolithography process. The first and second insulating capping patterns 139 and 145' may be defined as an insulating capping structure 147.

Figure 14:
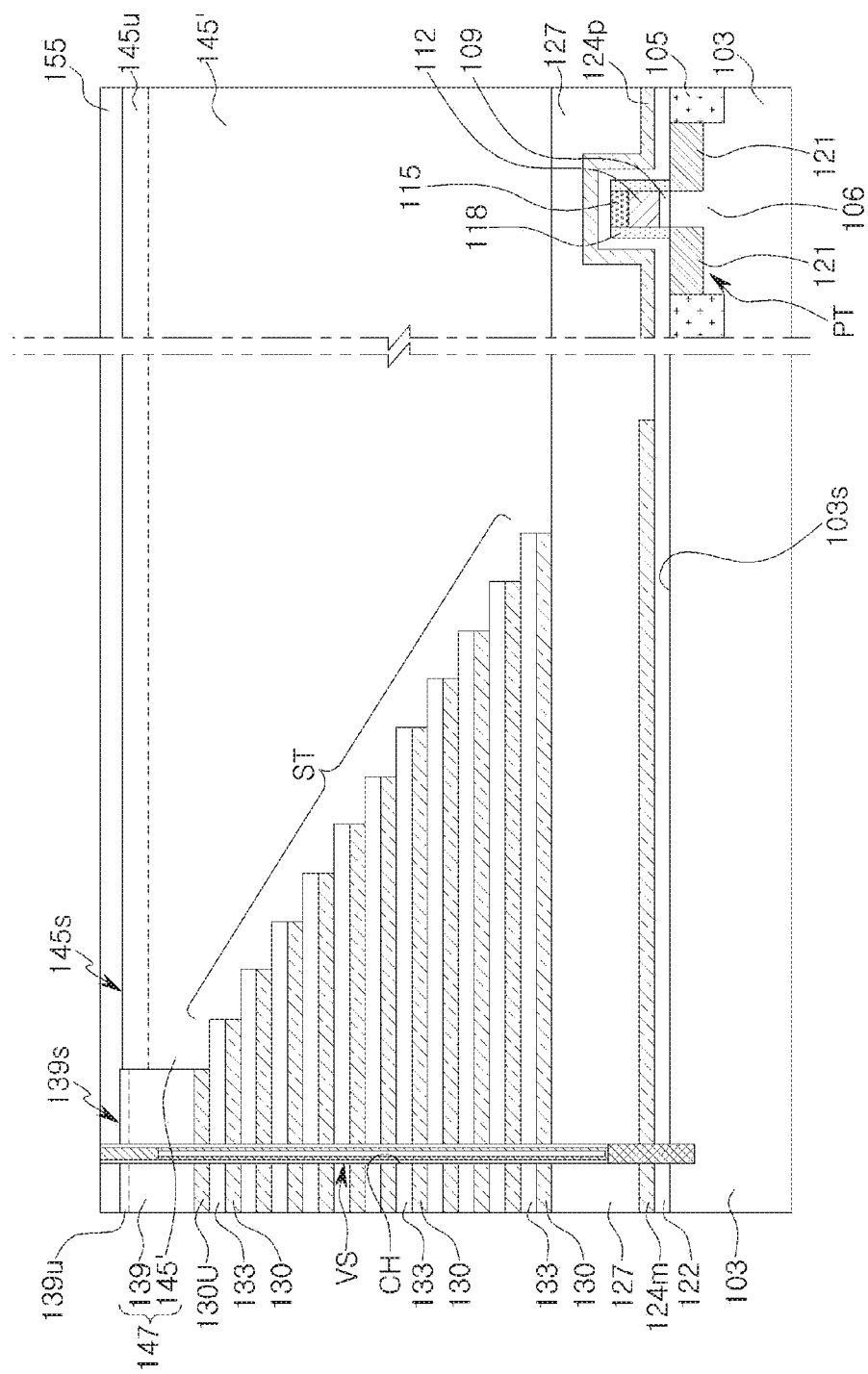

Referring to FIGS. 3 and 14, a first upper insulating layer 155 may be formed on the insulating capping structure 147. The first upper insulating layer 155 may be formed of a silicon oxide.

A channel hole CH may be formed through the first upper insulating layer 155, the first insulating capping pattern 139, the upper sacrificial layer 130U, the sacrificial layers 130, the interlayer insulating layers 133, the lower insulating layer 127, the lower sacrificial layer 124m, and the lowermost insulating layer 122.

A memory cell vertical structure VS may be formed within the channel hole CH as described above with reference to FIGS. 3, 4A, 4B, and 5. Forming the memory cell vertical structure VS may include, by performing an epitaxial process, forming a semiconductor pattern 160 of FIGS. 4A and 4B filling a lower region of the channel hole CH, forming a dielectric structure 167 of FIG. 4B on a side wall of the channel hole CH, forming a channel semiconductor layer 170 of FIG. 4B contacting the semiconductor pattern 160 of FIGS. 4A and 4B, while covering an inner side wall of the dielectric structure 167 of FIG. 4B, forming a core pattern 173 of FIG. 4B filling a portion of the channel hole CH, and forming a pad pattern 176 of FIG. 4B filling the remainder of the channel hole CH, formed on the core pattern 173 of FIG. 4B, and contacting the channel semiconductor layer 170 of FIG. 4B.

Figure 15A:
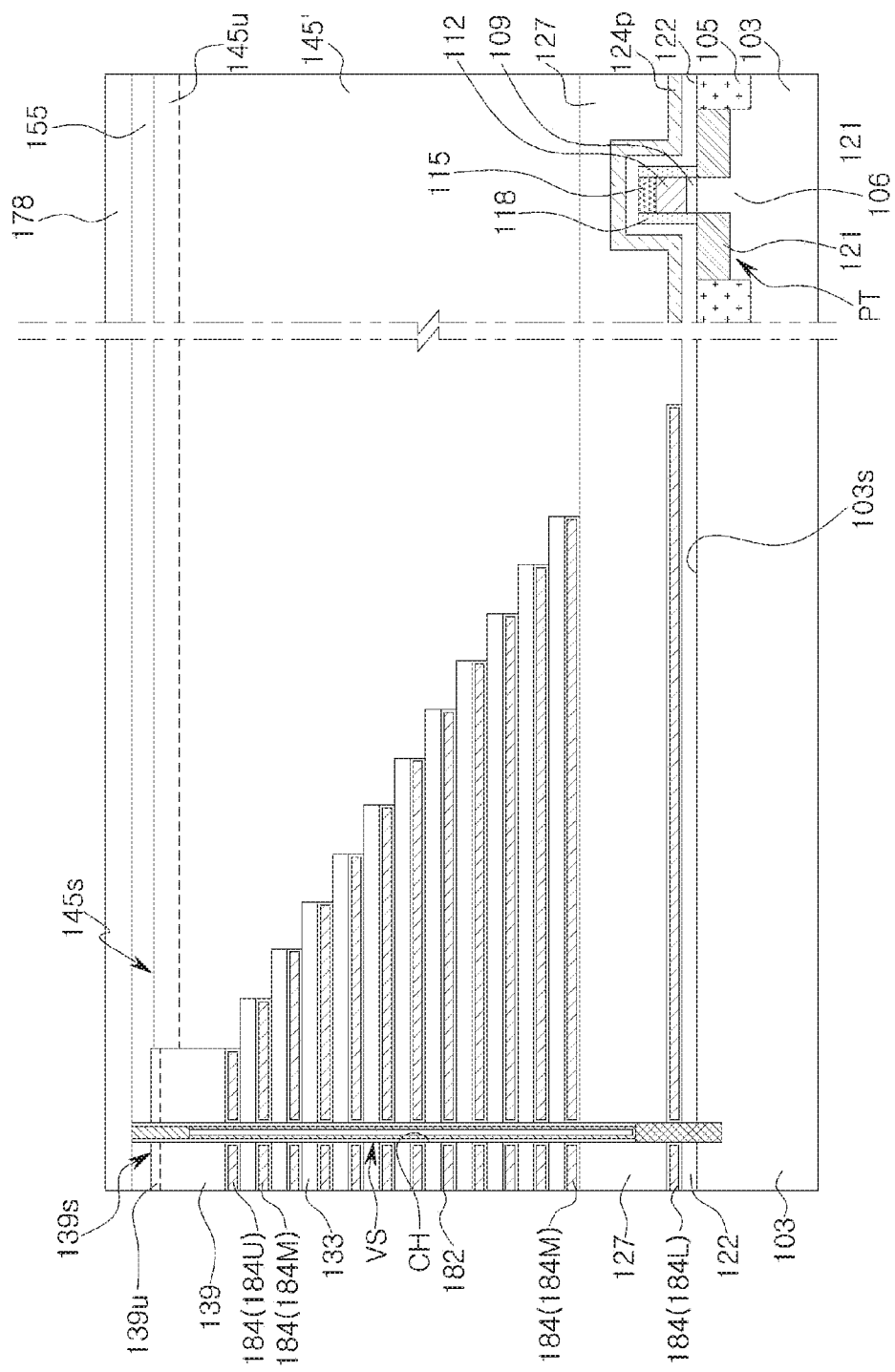
Figure 15B:
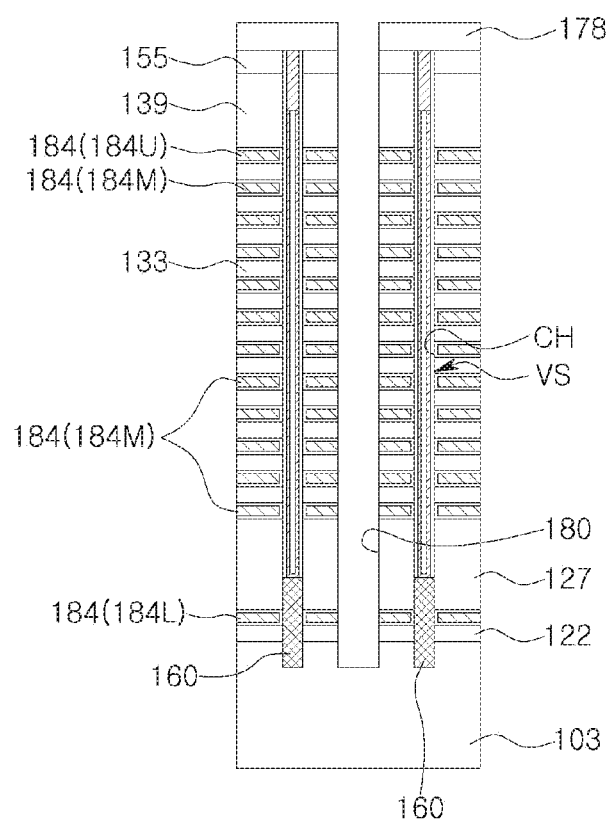

Referring to FIGS. 3, 15A, and 15B, a second upper insulating layer 178 may be formed on the first upper insulating layer 155. The second upper insulating layer 178 may be formed of a silicon oxide.

An separation trench 180 may be formed to extend to the substrate 103, while passing through the first and second upper insulating layers 155 and 178, the insulating capping structure 147, the upper sacrificial layer 130U of FIG. 14, the sacrificial layers 130 of FIG. 14, the interlayer insulating layers 133, the lower insulating layer 127, the lower sacrificial layer 124m of FIG. 14, and the lowermost insulating layer 122, thus exposing the substrate 103. Subsequently, empty spaces may be formed by removing the upper sacrificial layer 130U of FIG. 14, the sacrificial layers 130 of FIG. 14, and the lower sacrificial layer 124m of FIG. 14 that may be exposed by the separation trench 180, gate dielectrics 182 may be conformally formed on inner walls of the empty spaces, and gate electrodes 184 may be formed to fill the empty spaces.

In some embodiments, the size of the stepped portion between the first and second upper surfaces 139s and 145s of the first and second insulating capping patterns 139 and 145' may be less than a thickness of the gate dielectric 182.

Returning to FIGS. 3, 4A, 4B, and 5, an insulating spacer 186 may be formed on a side wall of the separation trench 180. An impurity region 188 may be formed within a portion of the substrate 103 exposed by the separation trench 180. A source pattern 190 may be formed to fill the separation trench 180. A third upper insulating layer 192 may be on the second upper insulating layer 178.

By performing a contact plug formation process, gate contact plugs 194U, 194M, and 194L electrically connected to the gate electrodes 184, and peripheral contact plugs 194P1 and 194P2 electrically connected to the peripheral transistor PT may be formed.

Forming the gate contact plugs 194U, 194M, and 194L may include, by performing a photolithography process and an etching process, forming contact holes that may allow exposure of the pad regions PU, PM, and PL of the gate electrodes 184 through the first to third upper insulating layers 155, 178, and 192, the insulating capping structure 147, the interlayer insulating layers 133, and the gate dielectric 182, and forming the contact holes with a conductive material. The peripheral contact plugs 194P1 and 194P2 may be formed by the same process as that of the gate contact plugs 194U, 194M, and 194L.

A bit line contact plug 196 may be formed to pass through the second and third upper insulating layers 178 and 192 and to be in contact with the pad pattern 176 of the memory cell vertical structure VS. Conductive patterns 198B, 198U, 198M, 198L, and 198P may be formed on the third upper insulating layer 192 as described above with reference to FIGS. 3, 4A, 4B, and 5. Thus, a semiconductor device may be formed as described above with reference to FIGS. 3, 4A, 4B, and 5.

The insulating capping structure 147 on the gate electrodes 184 may be formed to be divided into the first insulating capping pattern 139 and the second insulating capping pattern 145' having different properties, thus significantly reducing the stepped portion between the first upper surface 139s of the first insulating capping pattern 139 and the second upper surface 145s of the second insulating capping pattern 145'. As a result, a defect may be prevented from occurring due to the stepped portion between the first and second upper surfaces 139s and 145s in a following semiconductor formation process. For example, since the stepped portion between the first and second upper surfaces 139s and 145s is significantly reduced, a photolithography process for forming the gate contact plugs 194U, 194M, and 194L may be performed on a flat surface, and the gate contact plugs 194U, 194M, and 194L may be formed by the photolithography process without having a defect. Thus, the design of the semiconductor device may be modified, such that the size of the gate contact plugs 194U, 194M, and 194L may decrease or that the number of gate contact plugs 194U, 194M, and 194L may increase. As a result, a degree of integration of the semiconductor device may be increased.

As set forth above, according to some embodiments of the inventive concepts, an insulating capping structure on gate electrodes may be formed as a first insulating capping pattern and a second insulating capping pattern having different properties, thus providing a semiconductor device having an increased degree of integration thereof.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While some embodiments have been shown and described above, it will be apparent to those skilled in the art that modifications and variations could be made without departing from the scope of the inventive concepts and the scope of the following claims.

What is claimed is:

1. A semiconductor device, comprising:
  a plurality of vertically stacked gate electrodes on a substrate;
  an insulating capping structure on the plurality of gate electrodes, the insulating capping structure including a first upper surface and a second upper surface, a first distance between the first upper surface and a top surface of the substrate being greater than a second distance between the second upper surface and the top surface of the substrate, and the first upper surface not overlying the second upper surface;
  a memory cell vertical structure passing through the first upper surface, the plurality of gate electrodes, and the insulating capping structure, the memory cell vertical structure being laterally spaced apart from the second upper surface; and
  a bit line electrically connected to the memory cell vertical structure.

2. The semiconductor device of claim 1, wherein the insulating capping structure comprises a first insulating capping pattern comprising the first upper surface, and a second insulating capping pattern comprising the second upper surface.

3. The semiconductor device of claim 1, wherein the memory cell vertical structure comprises a channel semiconductor layer extending in a direction perpendicular to the top surface of the substrate, and a dielectric structure between the channel semiconductor layer and the plurality of gate electrodes.

4. The semiconductor device of claim 1, further comprising an upper insulating layer on the insulating capping structure,
wherein the memory cell vertical structure extends in a direction perpendicular to the top surface of the substrate to pass through the upper insulating layer.

5. The semiconductor device of claim 1,
wherein the plurality of gate electrodes are sequentially stacked in a memory cell array region of the substrate,
wherein the plurality of gate electrodes comprises a lower gate electrode, a plurality of intermediate gate electrodes on the lower gate electrode, and an upper gate electrode on the plurality of intermediate gate electrodes,
wherein the plurality of gate electrodes comprise pad regions extending from the memory cell array region to a connection region of the substrate, the pad regions being arranged to have a stepped shape, and
wherein the pad regions of the plurality of gate electrodes comprise an upper pad region of the upper gate electrode, intermediate pad regions of the plurality of intermediate gate electrodes, and a lower pad region of the lower gate electrode.

6. The semiconductor device of claim 2, wherein the first insulating capping pattern comprises a first oxide and the second insulating capping pattern comprises a second oxide, the second oxide being more porous than the first oxide and/or having a density lower than a density of the first oxide.

7. The semiconductor device of claim 3, wherein a difference between the first distance between the first upper surface and the top surface of the substrate and the second distance between the second upper surface and the top surface of the substrate is less than a thickness of the dielectric structure.

8. The semiconductor device of claim 3, further comprising: a gate dielectric between one of the plurality of gate electrodes and the memory cell vertical structure,
wherein a difference between the first distance between the first upper surface and the top surface of the substrate and the second distance between the second upper surface and the top surface of the substrate is less than a thickness of the gate dielectric.

9. The semiconductor device of claim 5,
wherein the first upper surface of the insulating capping structure overlaps the plurality of gate electrodes in the memory cell array region, and overlaps the upper pad region of the upper gate electrode, and
wherein the second upper surface of the insulating capping structure overlaps the intermediate pad regions and the lower pad region in the connection region.

10. The semiconductor device of claim 9, further comprising:
an upper gate contact plug passing through the first upper surface of the insulating capping structure, electrically connected to the upper pad region, and spaced apart from the second upper surface of the insulating capping structure; and
intermediate gate contact plugs passing through the second upper surface of the insulating capping structure, electrically connected to the intermediate pad regions, and spaced apart from the first upper surface of the insulating capping structure,
wherein a boundary between the first upper surface and the second upper surface of the insulating capping structure is between the intermediate gate contact plugs and the upper gate contact plug.

11. A semiconductor device, comprising:
a plurality of gate electrodes on a substrate;
an insulating capping structure on the plurality of gate electrodes, the insulating capping structure including a first surface layer and a second surface layer that is thicker than the first surface layer, and the first surface layer not overlying the second surface layer;
a channel hole passing through the plurality of gate electrodes and the insulating capping structure, passing through the first surface layer, and spaced apart from the second surface layer; and
a channel semiconductor layer within the channel hole, the channel semiconductor layer extending in a direction perpendicular to a top surface of the substrate,
wherein the insulating capping structure comprises a first insulating capping pattern including the first surface layer, and a second insulating capping pattern including the second surface layer,
wherein a thickness of the first surface layer of the first insulating capping pattern is less than a thickness of a remainder of the first insulating capping pattern, and
wherein a thickness of the second surface layer of the second insulating capping pattern is less than a thickness of a remainder of the second insulating capping pattern.

12. The semiconductor device of claim 11,
wherein the substrate includes a memory cell array region and a connection region,
wherein the plurality of gate electrodes are in the memory cell array region of the substrate and comprise pad regions extending to the connection region of the substrate, the pad regions being formed in the connection region to have a stepped shape,
wherein the plurality of gate electrodes comprises a lower gate electrode, a plurality of intermediate gate electrodes on the lower gate electrode, and an upper gate electrode on the plurality of intermediate gate electrodes, and
wherein the pad regions comprise an upper pad region of the upper gate electrode, intermediate pad regions of the plurality of intermediate gate electrodes, and a lower pad region of the lower gate electrode.

13. The semiconductor device of claim 11, wherein the insulating capping structure includes a first upper surface and a second upper surface, and
wherein a first distance between the first upper surface and the top surface of the substrate is greater than a second distance between the second upper surface and the top surface of the substrate.

14. The semiconductor device of claim 12, wherein the first surface layer overlaps the upper gate electrode and the upper pad region, and
the second surface layer overlaps the intermediate pad regions and the lower pad region.

15. The semiconductor device of claim 12, further comprising:
an upper gate contact plug passing through the first surface layer of the insulating capping structure, electrically connected to the upper pad region, and spaced apart from the second surface layer;

a plurality of intermediate gate contact plugs passing through the second surface layer of the insulating capping structure, electrically connected to the intermediate pad regions, and spaced apart from the first surface layer; and a lower gate contact plug passing through the second surface layer of the insulating capping structure, electrically connected to the lower pad region, and spaced apart from the first surface layer.

16. A semiconductor device, comprising:

a plurality of gate electrodes on a substrate;

an insulating capping structure on the plurality of gate electrodes, the insulating capping structure including a first upper surface and a second upper surface;

a channel hole extending in a direction perpendicular to a top surface of the substrate to pass through the first upper surface, the plurality of gate electrodes, and the insulating capping structure;

a semiconductor channel layer within the channel hole, the semiconductor channel layer extending in the direction perpendicular to the top surface of the substrate; and a dielectric structure between the semiconductor channel layer and the plurality of gate electrodes, wherein a difference between a first distance between the first upper surface and the top surface of the substrate and a second distance between the second upper surface and the top surface of the substrate is less than a thickness of the dielectric structure.

17. The semiconductor device of claim 16, wherein the first distance between the first upper surface and the top surface of the substrate is greater than the second distance between the second upper surface and the top surface of the substrate.

18. The semiconductor device of claim 16, further comprising: a gate dielectric between the dielectric structure and the plurality of gate electrodes, wherein the difference between the first distance between the first upper surface and the top surface of the substrate and the second distance between the second upper surface and the top surface of the substrate is less than a thickness of the gate dielectric.

19. The semiconductor device of claim 16, wherein the plurality of gate electrodes comprises word lines having word line pad regions, and a string select line on the word lines, the string select line having a string select line pad region, wherein the first upper surface of the insulating capping structure overlaps the string select line pad region, and wherein the second upper surface of the insulating capping structure overlaps the word line pad regions.

20. The semiconductor device of claim 19, further comprising:

a peripheral transistor on the substrate; and a lower insulating layer on the peripheral transistor, wherein the plurality of gate electrodes further comprises a ground select line below the word lines, and wherein the lower insulating layer is between the word lines and the ground select line.

* * * * *